(12) United States Patent
Zhang et al.

(10) Patent No.: US 6,770,143 B2
(45) Date of Patent: Aug. 3, 2004

(54) METHOD FOR ANNEALING A SEMICONDUCTOR

(75) Inventors: Hongyong Zhang, Kanagawa (JP); Naoto Kusumoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/225,132

(22) Filed: Aug. 22, 2002

(65) Prior Publication Data

US 2003/0015133 A1 Jan. 23, 2003

Related U.S. Application Data

(62) Division of application No. 09/695,413, filed on Oct. 25, 2000, now Pat. No. 6,494,162, which is a division of application No. 08/721,540, filed on Sep. 26, 1996, now Pat. No. 6,174,374, which is a division of application No. 08/275,909, filed on Jul. 15, 1994, now Pat. No. 5,578,520, which is a continuation-in-part of application No. 08/104,614, filed on Aug. 11, 1993, now Pat. No. 5,352,291, which is a continuation of application No. 07/886,717, filed on May 22, 1992, now abandoned.

(30) Foreign Application Priority Data

May 28, 1991 (JP) .......................................... 03-152477

(51) Int. Cl.[7] ............................................. C23C 16/00
(52) U.S. Cl. ........................ 118/715; 118/719; 117/904
(58) Field of Search ................................ 118/715, 719; 156/345; 117/58, 904, 900; 438/795, 758

(56) References Cited

U.S. PATENT DOCUMENTS 4,151,058 A  4/1979 Kaplan et al.
4,226,898 A  10/1980 Ovshinsky et al.

(List continued on next page.)

FOREIGN PATENT DOCUMENTS

EP  0 211 634  2/1987
JP  57-180116  11/1982
JP  60-042817  3/1985
JP  60-105216  6/1985
JP  60-227484  11/1985
JP  62-104117  5/1987
JP  63-160336  7/1988
JP  63-224318  9/1988
JP  01-072522  3/1989
JP  01-179410  7/1989
JP  01-251734  10/1989
JP  02-012812  1/1990
JP  02-073623  3/1990
JP  02-081424  3/1990
JP  02-103924  4/1990
JP  02-239615  9/1990
JP  02-257619  10/1990
JP  02-295111  12/1990
JP  03-024717  2/1991
JP  03-286518  12/1991

OTHER PUBLICATIONS

Sera et al., "High–Performance TFT's Fabricated by XeCl Excimer Laser Annealing of Hydrogenated Amorphous–Silicon Film", pp. 2868–2872, Dec. 1989, IEEE Transactions on Electron Devices, vol. 36, No. 12.

Sameshima et al., "XeCl Excimer Laser Annealing Used to Fabricate Poly–Si TFT's", pp. 1789–1793, Oct. 1989, Japanese Journal of Applied Physics, vol. 28, No. 10.

(List continued on next page.)

*Primary Examiner*—Nadine G. Norton
*Assistant Examiner*—Matthew Anderson
(74) *Attorney, Agent, or Firm*—Nixon Peabody LLP; Jeffrey L. Costellia

(57) ABSTRACT

A method for manufacturing a semiconductor device including preparing a multi-chamber system having at least first and second chambers, the first chamber for forming a film and the second chamber for processing an object with a laser light; processing a substrate in one of the first and second chambers; transferring the substrate to the other one of the first and second chambers; and processing the substrate in the other one of the chambers, wherein the first and second chambers can be isolated from one another by using a gate valve.

24 Claims, 4 Drawing Sheets

U.S. PATENT DOCUMENTS

| | | |
|---|---|---|
| 4,309,225 A | 1/1982 | Fan et al. |
| 4,313,783 A | 2/1982 | Davies et al. |
| 4,322,253 A | 3/1982 | Pankove et al. |
| 4,370,175 A | 1/1983 | Levatter |
| 4,379,727 A | 4/1983 | Hansen et al. |
| 4,388,145 A | 6/1983 | Hawkins et al. |
| 4,402,762 A | 9/1983 | John et al. |
| 4,405,435 A | 9/1983 | Tateishi et al. |
| 4,406,709 A | 9/1983 | Celler et al. |
| 4,436,557 A | 3/1984 | Wood et al. |
| 4,475,027 A | 10/1984 | Pressley |
| 4,482,395 A | 11/1984 | Hiramoto |
| 4,498,416 A | 2/1985 | Bouchaib |
| 4,503,807 A | 3/1985 | Nakayama |
| 4,523,370 A | 6/1985 | Sullivan et al. |
| 4,552,595 A | 11/1985 | Hoga |
| 4,557,036 A | 12/1985 | Kyuragi et al. |
| 4,567,061 A | 1/1986 | Hayashi et al. |
| 4,571,348 A | 2/1986 | Troxell |
| 4,576,851 A | 3/1986 | Iwamatsu |
| 4,582,720 A | 4/1986 | Yamazaki |
| 4,589,951 A | 5/1986 | Kawamura |
| 4,590,091 A | 5/1986 | Rogers, Jr. et al. |
| 4,592,306 A | 6/1986 | Gallego |
| 4,592,799 A | 6/1986 | Hayafuji |
| 4,595,601 A | 6/1986 | Horioka et al. |
| 4,609,407 A | 9/1986 | Masao et al. |
| 4,640,223 A | 2/1987 | Dozier |
| 4,663,829 A | 5/1987 | Hartman et al. |
| 4,694,143 A | 9/1987 | Nishimura et al. |
| 4,698,486 A | 10/1987 | Sheets |
| 4,699,863 A | 10/1987 | Sawatari et al. |
| 4,719,123 A | 1/1988 | Haku et al. |
| 4,800,174 A | 1/1989 | Ishihara et al. |
| 4,808,554 A | 2/1989 | Yamazaki |
| 4,843,022 A | 6/1989 | Yamazaki |
| 4,888,305 A | 12/1989 | Yamazaki et al. |
| 4,937,205 A | 6/1990 | Nakayama et al. |
| 4,951,601 A * | 8/1990 | Maydan et al. ............. 118/719 |
| 4,988,642 A | 1/1991 | Yamazaki |
| 5,091,334 A | 2/1992 | Yamazaki et al. |
| 5,141,058 A | 8/1992 | Heppner |
| 5,145,808 A | 9/1992 | Sameshima et al. |
| 5,149,675 A | 9/1992 | Wille et al. |
| 5,171,710 A | 12/1992 | Yamazaki et al. |
| 5,174,881 A | 12/1992 | Iwasaki et al. |
| 5,186,718 A | 2/1993 | Tepman et al. |
| 5,194,398 A | 3/1993 | Miyachi et al. |
| 5,198,371 A | 3/1993 | Li |
| 5,200,017 A | 4/1993 | Kawasaki et al. |
| 5,219,786 A | 6/1993 | Noguchi |
| 5,234,528 A | 8/1993 | Nishi |
| 5,266,116 A | 11/1993 | Fujioka et al. |
| 5,288,658 A | 2/1994 | Ishihara |
| 5,292,675 A | 3/1994 | Codama |
| 5,296,405 A | 3/1994 | Yamazaki et al. |
| 5,304,357 A | 4/1994 | Sato et al. |
| 5,306,651 A | 4/1994 | Masumo et al. |
| 5,310,410 A | 5/1994 | Begin et al. |
| 5,314,538 A | 5/1994 | Maeda et al. |
| 5,314,839 A | 5/1994 | Mizutani et al. |
| 5,324,360 A | 6/1994 | Kozuka |
| 5,352,291 A * | 10/1994 | Zhang et al. ................... 117/8 |
| 5,372,836 A | 12/1994 | Imahashi et al. |
| 5,578,520 A * | 11/1996 | Zhang et al. ................. 437/81 |
| 5,708,252 A | 1/1998 | Shinohara et al. |
| 5,861,337 A | 1/1999 | Zhang et al. |
| 6,174,374 B1 * | 1/2001 | Zhang et al. ................ 118/715 |
| 6,494,162 B1 * | 12/2002 | Zhang et al. ................... 118/8 |

OTHER PUBLICATIONS

Tanenaka et al., "High Mobility Poly–Si Thin Film Transistors Using Solid Phase Crystalized a Si–Film Deposited by Plasma–Enhanced Chemical Vapor Deposition", pp. 2380–2383, Dec. 1990, Japanese Journal of Applied Physics, vol. 29, No. 12.

English Translation (20 pages) of Nikkei Microdevices pp. 34–39, Oct. 1989.

Wagner et al., "Formation of p–n Junctations and Silicides in Silicon Using a High Performance Laser Beam Homogenization System", pp. 260–263 Applied Surface Science, vol. 43.

Jhon et al., "Crystallization of Amorphous Silicon by Excimer Laser Annealing with a Line Shape Beam Having a Gaussian Profile", pp. L1438–L1441, Oct. 1994, Jpn., J. Appl. Phyus., vol. 33, Part 2, No. 10B.

Kuwano, "Photovoltaic Behavior of Amorphous Si:H and SiF:H Solar Cells", pp. 698–703, Published Aug. 1981, Conference Record, 15th IEEE Phtovoltaic Specialists Conference, Kissimmee, Florida May 12–15, 1981.

* cited by examiner

METHOD FOR ANNEALING A SEMICONDUCTOR

REFERENCE TO RELATED APPLICATION

Divisional of prior application Ser. No. 09/695,413 filed Oct. 25, 2000 now U.S. Pat. No. 6,494,162; which itself is a Divisional of Ser. No.: 08/721,540 filed Sep. 26, 1996, now U.S. Pat. No. 6,174,374; which is a Division of Ser. No. 08/275,909 filed Jul. 15, 1994, now U.S. Pat. No. 5,578,520; which is a Continuation-in-Part of Ser. No. 08/104,614 filed Aug. 11, 1993, now U.S. Pat. No. 5,352,291 (which has been reexamined and issued as U.S. Pat. No. B15,352,291); which is a Continuation of Ser. No. 07/826,717 filed May 22, 1992 abandoned.

BACKGROUND OF THE INVENTION

1. Field of the Invention

The present invention relates to a method for annealing a semiconductor, in particular, to an annealing process for obtaining a polycrystal semiconductor used in a thin film device such as an insulated gate field effect transistor by laser irradiation.

2. Description of Prior Art

Thin films of polycrystalline silicon semiconductor for use in a tin film device such as a thin film insulated gate field effect transistor (abbreviated hereinafter as a TFT) have been fabricated heretofore by first depositing amorphous silicon films by plasma-assisted chemical vapor deposition (CVD) or thermal CVD processes, and then irradiating a laser beam thereto to crystallize the thus deposited amorphous silicon films.

The process of crystallizing an amorphous silicon film by irradiating a laser beam comprises, in general, first irradiating a low energy density laser beam to the amorphous silicon film to allow desorption of hydrogen having incorporated into the starting amorphous silicon film, and then irradiating a laser beam at an energy density well above the threshold energy density (a minimum energy density necessary to initiate melting of silicon).

A laser beam having a sufficiently low energy should be irradiated to the amorphous silicon film for the purpose of releasing the hydrogen being incorporated in the film because, if a beam of a high energy density corresponding to the threshold value or higher were to be irradiated, there occur two problems. One is a problem which involves abrupt evolution of a considerable amount of hydrogen from the surface of an amorphous silicon film upon irradiating the laser beam. Such a phenomenon greatly impairs the smoothness of the film surface; the resulting film cannot provide a favorable interface level when an insulator film is established on the surface of the thus crystallized silicon film, because a level develops at the interface between the silicon film, and the insulator film. The other problem is the hydrogens present in large amount in the amorphous silicon film; they not only evolve out of the surface upon irradiation of a high energy laser beam having an energy density not lower than the threshold value, but also move inside the melting silicon film with a large kinetic energy to impede the crystallization of the silicon itself.

Accordingly, a conventional laser annealing processes involves a so-called pre-laser annealing step which comprises irradiating a low energy density laser beam to sufficiently drive out hydrogen atoms having incorporated inside the film, followed by the irradiation of a laser beam having a satisfactorily high energy density to effect crystallization of the film. In this manner, the influence of the hydrogen inside the film on the film crystallization can be eliminated.

The conventional laser annealing processes, however, suffer disadvantages as follows.

Firstly, the laser annealing process should be conducted in two steps. Such a process is not suitable for processing large-area substrates. Moreover, it suffers poor efficiency.

Secondly, the most generally used excimer lasers which are operated in a pulsed mode are not suitable for completely driving hydrogen out of the film; the duration of the laser irradiation per pulse is too short.

Furthermore, any laser apparatus for use in the laser annealing inevitably suffers a non-uniform laser beam output and a fluctuation in power output. Those attributes make the hydrogen distribution non-uniform inside the film upon driving hydrogen atoms out of the film. Such a film having a non-uniform hydrogen distribution therein results in a crystallized film consisting of crystal grains of non-uniform grain diameter.

SUMMARY OF THE INVENTION

The present invention relates to a laser annealing process having overcome the aforementioned problems.

More specifically, the present invention provides a method for annealing a semiconductor comprising the steps of:

thermally annealing an amorphous semiconductor in vacuum or inactive atmosphere at a temperature not higher than a crystallization temperature of said amorphous semiconductor; and irradiating said amorphous semiconductor with a laser light in vacuum or inactive atmosphere after said thermally annealing step to crystallize said amorphous semiconductor.

The laser to be used in the process in general is an excimer laser, but it should be noted that the construction of the present invention is by no means restricted to the use thereof, and hence, any type of laser can be employed in the process.

The generally used amorphous semiconductor, but not limiting, is a silicon semiconductor. In the description of the present invention hereinafter, however, a silicon semiconductor is used for purpose of explanation.

The thermal annealing of the amorphous semiconductor in vacuum or in an inactive gas atmosphere at a temperature not higher than the crystallization temperature of said amorphous semiconductor is conducted for the purpose of driving hydrogen out of the amorphous semiconductor. If this step of thermal annealing were to be conducted at a temperature not lower than the crystallization temperature of the amorphous semiconductor, crystallization would occur on the semiconductor, thereby making the subsequent crystallization by laser irradiation insufficient. Accordingly, it is an important point that the thermal annealing is conducted at a temperature not higher than the crystallization temperature of the semiconductor.

The thermal annealing step should be effected in vacuum or in an inactive gas atmosphere to avoid formation of an undesirable thin film, such as an oxide film, on the surface of the amorphous semiconductor.

Hydrogen can be uniformly and thoroughly driven out of the film by annealing the amorphous semiconductor at a temperature not higher than the crystallization temperature. The semiconductor films thus obtained have improved uniformity for both the intra-planar distribution of crystallinity and the size of the constituting crystal grains. Such semiconductor films enable fabrication of polycrystalline silicon (abbreviated sometimes as "p-Si", hereinafter) TFTs having uniform characteristics over a large-area substrate.

The crystallization of the amorphous semiconductor in vacuum or in an inactive gas atmosphere by irradiating a laser beam thereto is conducted to prevent the dangling bonds, which have once formed upon driving hydrogen out of the amorphous semiconductor, from bonding with oxygen and hydrogen and nitrogen present in the active gas, i.e., air.

The present invention is characterized in one aspect that a large amount of dangling bonds are produced in the amorphous semiconductor to accelerate crystallization of the film. This is based on the fact obtained experimentally by the present inventors, which is described below. It has been found that the crystallinity of an amorphous silicon film having subjected to a thorough driving out of hydrogen remarkably improves by irradiating an excimer laser light (a KrF laser emitting light at wavelength 248 nm) to the film.

An amorphous silicon film in general contains a large amount of hydrogen to neutralize the dangling bonds within the amorphous silicon film. The present inventors, however, realized the important role which the dangling bonds play at the crystallization of the film from its amorphous molten state, and therefore intentionally allowed the dangling bonds to form in the amorphous state to enhance instantaneous crystallization from the molten state. In the course of the crystallization taking advantage of the thus formed dangling bonds, it is very important to irradiate the laser beam in vacuum or in an inactive gas atmosphere, as mentioned earlier, because the exposure of the surface of the thus obtained semiconductor film to air causes bonding (neutralization) of the dangling bonds with oxygen, etc., to form an oxide film and the like on the surface of the film.

The annealing according to the process of the present invention should be conducted at a temperature not higher than the crystallization temperature of the amorphous semiconductor. The crystallization temperature as referred herein signifies the temperature at which the amorphous semiconductor initiates crystallization by thermal annealing. The thermal annealing at a temperature not higher than the crystallization temperature according to the process of the present invention is conducted on the basis of an experimentally derived fact that the improvement of crystallinity is hardly observed by irradiating a laser beam to a once crystallized film, and that those crystallized films are considerably low in crystallinity as compared with the films having crystallized by irradiating a laser beam to films still in their amorphous state.

It can be seen, accordingly, that it is of great importance to drive the hydrogen atoms out of the amorphous semiconductor film at a temperature not higher than the crystallization temperature of the amorphous semiconductor film. However, hydrogen atoms are preferably driven out of the amorphous semiconductor by thermal annealing at a temperature as high as possible, provided that the film does not initiate crystallization; it is of grave importance in the process according to the present invention to form as many dangling bonds as possible in the film while thoroughly driving hydrogen out of the film.

The thermal annealing of the film to drive hydrogen out of the film is characterized by that, unlike the conventional processes which use laser beams at a low energy density, it enables a uniform and thorough elimination of hydrogen from the amorphous semiconductor film.

The process according to the present invention therefore is of great advantage concerning that it realizes a polycrystalline semiconductor film composed of large and uniform crystal grains.

DETAILED DESCRIPTION OF THE PREFERRED EMBODIMENTS

Now the present invention is explained in further detail below, referring to non-limiting examples.

EXAMPLE 1

EXAMPLE 1 shows experimentally the effect of thermal annealing of driving hydrogen out of an amorphous silicon film on laser crystallization of the film (crystallization of the film by irradiating a laser beam).

On a 1,000 Å thick silicon oxide film having deposited on a glass substrate as a protective film for the base film was further deposited a 100 nm thick amorphous silicon (a-Si) film by a plasma CVD process under conditions as follows:

| | |
|---|---|
| RF power: | 50 W |
| Reaction pressure: | 0.05 Torr |
| Reactive gas flow: | $H_2$ = 45 sccm |
| | $SiH_4$ = 5 sccm |
| Substrate temperature: | 300° C. |

Two types of specimen were fabricated in accordance with the process above. One was not subjected to thermal annealing, whereas the other was thermally annealed at 500° C. for one hour in an atmosphere of an inactive gas, i.e., $N_2$ gas. To both of the film specimens were irradiated a KrF excimer laser beam at a wavelength of 248 nm in vacuum to effect crystallization of the a-Si film. The laser crystallization was conducted in one shot, while varying the energy density of the laser.

The substrate during the laser irradiation step was not heated in this case, but otherwise the laser crystallization may be conducted with the substrate being maintained at 500° C., i.e., the temperature of thermal annealing which had been effected prior to the laser crystallization. It should be noted, however, that the thermal annealing for the purpose of driving hydrogen out of the film need not be conducted at 500° C. Furthermore, the thermal annealing, which was effected at 500° C. for an hour in the present example, can be carried out at various temperatures and durations, depending on the process and the semiconductor film employed in the individual cases.

The two types of specimens thus obtained were subjected to the measurement of Raman spectra to study the crystallinity of both specimens.

Figure 1:
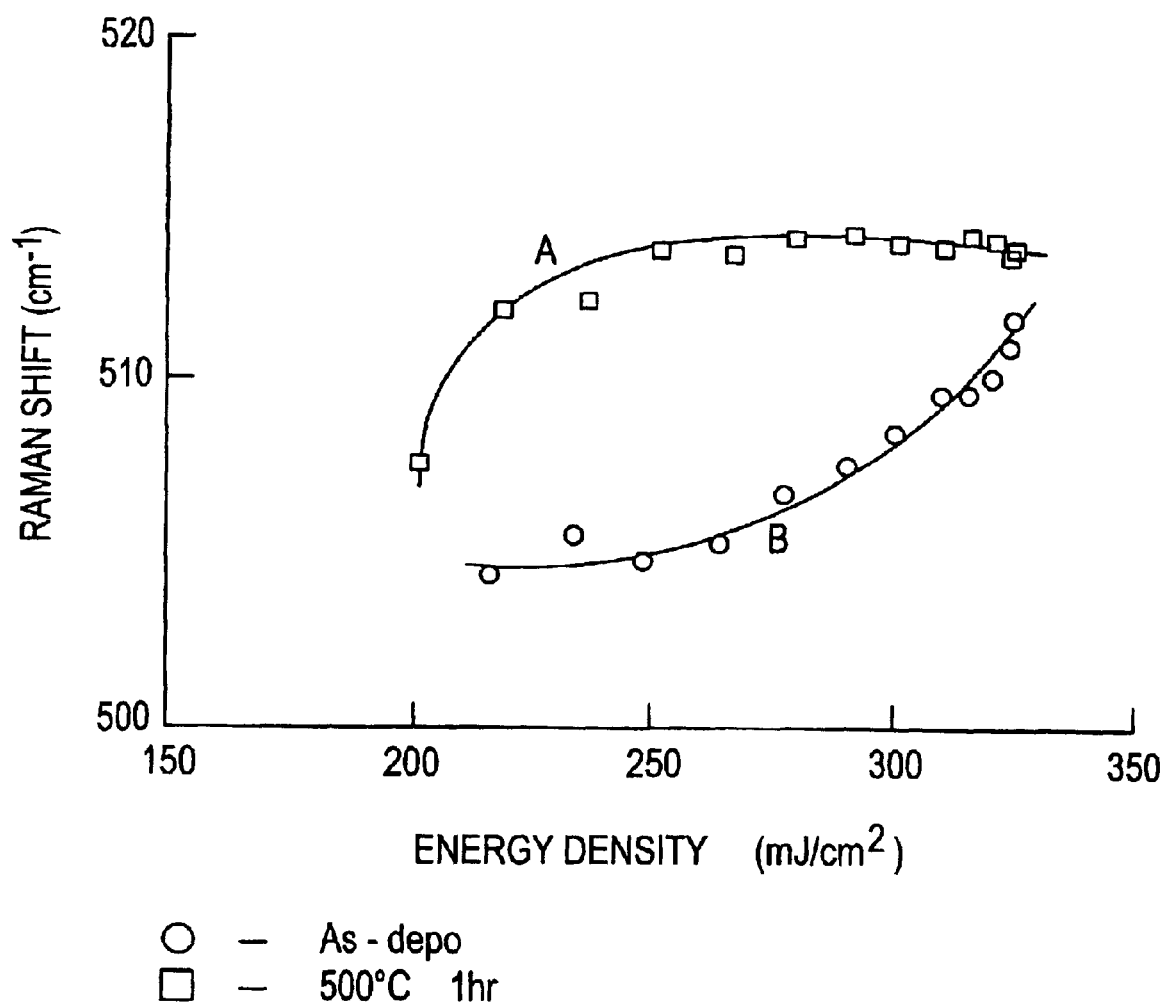
FIG. 1 is a graph showing the relationship between the Raman spectrum of a polycrystalline semiconductor film obtained by a process according to an embodiment of the present invention and the energy density of the laser beam having irradiated to the film.

In FIG. 1 are shown curve A and curve B. Curve A shows the relationship between the peaks in the Raman spectra and the varying energy density of the laser light having irradiated for the crystallization to a specimen having subjected to thermal annealing (500° C., 1 hour) prior to the laser crystallization process. Curve B relates the peaks in the Raman spectra to the varying energy density of the laser light having irradiated for the crystallization of a specimen not having subjected to thermal annealing prior to the laser crystallization.

Referring to FIG. 1, Curve A, it can be seen that the specimen having subjected to thermal annealing prior to the laser crystallization yields a peak at the vicinity of 521 cm$^{-1}$, i.e., the peak of a single crystal silicon, and that such a thermal annealing enables formation of crystallized silicon having a good crystallinity even upon irradiation of a laser at a low energy, density.

In general, it is well accepted that a silicon film having crystallized from amorphous silicon yields a peak in the Raman spectrum at a wavenumber nearer to 521 cm$^{-1}$, the peak of a single crystal silicon, with increasing crystal grain diameter of the film. It can be seen from the fact above that the thermal annealing conducted for driving hydrogen out of the film enables formation of larger crystal grains.

Referring to Curve B, it can be seen that the crystallinity of the film without thermal annealing for hydrogen elimination greatly depends on the energy density of the laser beam having irradiated at the laser crystallization. Furthermore, it shows that a favorable crystallinity can be obtained only by irradiating a laser beam at a high energy density.

It has been known that the energy density of a beam emitted from an excimer laser apt to fluctuate; this instability in the energy density has long constituted a problem. However, the crystallinity is not largely dependent on the laser beam intensity in such a case the peak of the Raman spectra and the energy density of the laser beam being irradiated at the laser crystallization yield a relationship therebetween corresponding to Curve A; thus, a crystalline film (a p-Si film in the present example) having a uniform crystallinity can be obtained without being influenced by the instability of the excimer laser.

In the case in which no thermal annealing is effected to drive hydrogen out of the film and therefore yields Curve B, a polycrystalline film having a non-uniform crystallinity results by the fluctuation in the energy density of the laser beam.

The practical fabrication process for semiconductor devices is largely concerned with how to obtain devices having uniform characteristics. It can be seen that the laser crystallization process which yield a polycrystalline film having a favorable crystallinity irrespective of the energy density of the laser beam having irradiated to the film, i.e., the process which yields Curve A, is useful for the practical fabrication of semiconductor devices.

By a closer examination of FIG. 1, Curve A, it can be seen also that the specimen having subjected to thermal treatment (thermal annealing for driving hydrogen out of the film) initiates crystallization upon irradiation of a laser beam having a lower energy density.

It can be concluded therefrom that the lowest energy density (threshold energy density) to initiate the crystallization is further lowered by effecting thermal annealing to the film for driving hydrogen out of the film.

Accordingly, the present inventors deduced conclusively that the threshold energy density for the crystallization can be lowered by driving hydrogen thoroughly out of the amorphous silicon film and thereby allowing formation of dangling bonds at a large quantity in the film.

EXAMPLE 2

Figure 2:
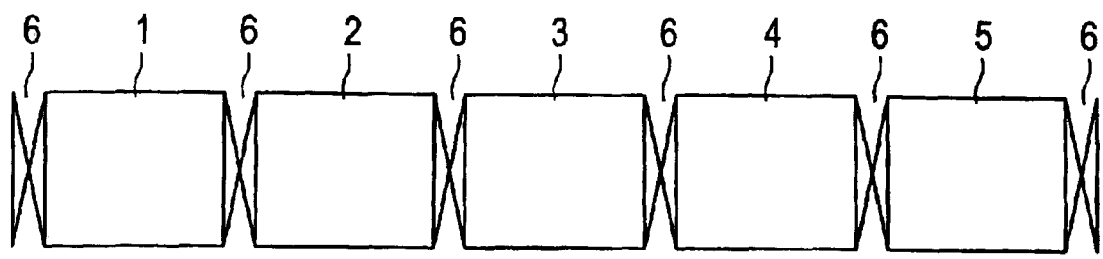
FIG. 2 is a schematic drawing which shows a structure of a multi-chamber apparatus for use in EXAMPLE 2 according to an embodiment of the present invention.

Referring to FIG. 2, a laser crystallization process using a multi-chamber apparatus is described below. In this process, the multi-chamber apparatus is used so that an amorphous silicon film having subjected to thermal annealing for driving hydrogen out of the film can be directly put to the subsequent laser crystallization step without once exposing its surface to the air.

The apparatus for use in this process is shown schematically in FIG. 2. The apparatus comprises, in a serial arrangement, a plasma CVD apparatus 2 for depositing amorphous silicon film for use as the starting film, a thermal annealing furnace 3 to drive hydrogen out of the film, a chamber 4 to effect therein laser crystallization of the film, a chamber 1 for feeding the specimen, and a chamber 5 for discharging the specimen. Though not shown in FIG. 2, there may be established, if necessary, a gas supply system to each of the chambers 1 to 5 in order to introduce an active or an inactive gas, or a transportation system for transfer of the specimen. To each of the chambers is also provided a vacuum evacuation apparatus comprising a turbo molecular pump and a rotary pump being connected in series, so that the impurity concentration, particularly the oxygen concentration, inside the chamber may be maintained as low as possible. It is also effective to separately establish a cryopump.

The multi-chamber apparatus as shown in FIG. 2 can be partitioned into the chambers 1, 2, 3, 4 and 5 by gate valves 6. The gate valve functions, for example, to avoid the reactive gas inside the chamber 2, i.e., the plasma CVD apparatus, from being introduced inside the thermal annealing furnace 3 being established for driving hydrogen out of the film.

The chamber 3 is a thermal annealing furnace for driving hydrogen out of the film, in which an infrared lamp was used for the heating means. The heating means is not restricted to the use of an infrared lamp, and other means, such as a heater, can be used in the place thereof.

The chamber 4, in which the laser annealing is effected, comprises a quartz window at the upper portion thereof. A laser beam is irradiated to the film through this window from an exterior laser-emitting apparatus equipped with an optical system.

The laser beam is adjusted with an optical system so that the cross section thereof may have a rectangular shape, at a predetermined width corresponding to that of the substrate and being elongated along a direction vertical to the direction of transporting the substrate. In this manner, the specimen can be continuously irradiated with the laser beam from its edge to edge and annealed efficiently, by slowly moving the specimen while fixing the laser system.

In the process using the apparatus shown in FIG. 2, the specimen preferably is thermally annealed and subsequently subjected to laser crystallization without interrupting the vacuum state. By thus conducting continuously the thermal annealing and laser crystallization in vacuum, neutralization of the dangling bonds can be avoided and hence the threshold energy density for the crystallization can be lowered. This provides polycrystalline silicon films composed of large-sized grains efficiently through the laser crystallization step.

The present process was described referring to a particular case using an apparatus comprising chambers being connected in series. However, a modified apparatus comprises a plurality of chambers for each step in accordance with the process duration of the specimen within each chamber. Furthermore, modifications may be made on the apparatus so that the chambers are each provided with a common room for supplying the specimen. The productivity can be improved by employing such an arrangement in which a plurality of treatments can be proceeded simultaneously by taking advantage of time difference.

The apparatus hereinbefore was described in connection with a process of depositing a film by plasma CVD. However, the film deposition may be carried out by other processes such as sputtering and thermal CVD; moreover, for example, a film deposition apparatus for depositing an insulating film therein may be further connected to the multi-chamber apparatus above, depending on the desired sequence for fabricating a film.

Conclusively, the present invention provides process which comprises a thermal annealing of an amorphous semiconductor film at a temperature not higher than the crystallization temperature of the film in vacuum or in an inactive gas atmosphere, followed by crystallization of the film in vacuum or in an inactive gas atmosphere by irradiating a laser beam to the film. The process provides a uniform polycrystalline silicon film having high crystallinity, which has less dependence on the energy density of the laser beam which is irradiated thereto for crystallization.

While the invention has been described in detail and with reference to specific embodiments thereof, it will be apparent to one skilled in the art that various changes and modifications can be made therein without departing from the spirit and scope thereof.

Figure 3:
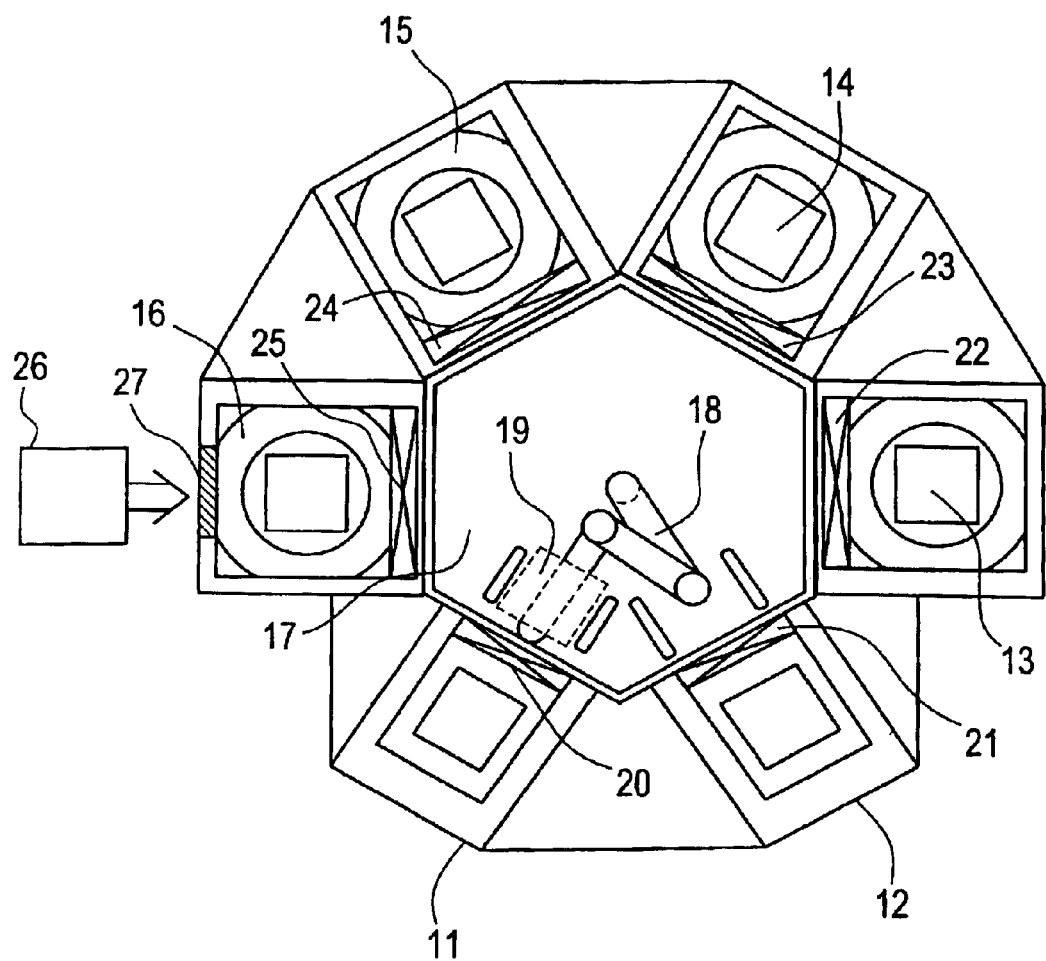
FIG. 3 is a diagrammatic plan view of a multi-chamber system for fabricating TFTs on a substrate in accordance with an embodiment of the present invention.

The following is an additional description explaining another embodiment of the present invention, A multi-chamber system for fabricating TFTs on a substrate is shown in FIG. 3. The multi-chamber system utilized in this embodiment is a modification of the system shown in FIG. 2. While the chambers are serially connected in one line in the system of FIG. 2, a plurality of chambers are connected with one another through one common chamber in the present embodiment, as referred to hereinbefore.

Referring to FIG. 3, the system comprises loading and unloading chambers 12 and 11, a plasma CVD chamber 13 for forming an amorphous silicon, a heat treatment chamber 14, a sputtering chamber 15 for forming a silicon oxide and a laser processing chamber 16. These chambers are connected with a common chamber (transfer chamber) 17 through gate valves 20–25, respectively. Also, a robot 18 is provided in the common chamber for transferring a substrate between the chambers. Further, although not shown in the figure, each chamber including the common chamber may be provided with its own vacuum pump. Accordingly, each process chamber can be operated completely isolated from one another.

The manufacture of a TFT on a substrate 19 for an active matrix liquid crystal device will be described below in connection with FIG. 3 and FIGS. 4A–4C.

Initially, after the loading chamber 12 is loaded with a glass substrate such as Corning 7059 glass and is pumped down, the gate valve 21 is opened and allows access to the substrate by the robot 18.

The robot 18 transfers it into the plasma CVD chamber 13 through the transfer chamber 17.

After the chamber 13 is loaded with the substrate and the gate valve 22 is closed, the chamber 13 is pumped down and the CVD formation of the amorphous silicon film is started. An example of the process parameters is as below:

| Starting gas: | $SiH_4$ diluted with hydrogen |
|---|---|
| substrate temperature: | 250° C. |
| film thickness: | 300 Å |
| Power: | 13.56 MHz r.f. power |

Then, in the same manner, the substrate 19 is transferred from the chamber 13 to the heat treatment chamber 14 by the robot 18. The substrate 19 having the amorphous silicon 31 is heated at 500° C. for one hour in $N_2$ gas. Thereby, hydrogen can be discharged from the amorphous silicon film 31.

The substrate is then transferred from the chamber 14 to the sputtering chamber 15. In the chamber 15, a silicon oxide film 32 is deposited on the amorphous silicon film 31 to form a protective layer for the subsequent laser annealing. The process parameters may be as below:

| target: | artificial quartz |
|---|---|
| sputtering gas: | Ar 25%-$O_2$ 75% |
| substrate temperature: | 100° C. |
| power: | 13.56 MHz, 400 W |
| film thickness: | 100 nm |

After the formation of the silicon oxide layer 32, the substrate is then transferred to the laser processing chamber 16 by the robot 18. The chamber 16 is provided with a quartz window 27 through which a laser light is emitted into the inside of the chamber 16 from a KrF excimer laser 26 located outside the chamber 16. In the chamber 16, a laser crystallization of the amorphous silicon film 31 is performed in an oxygen gas. The condition of the laser annealing is shown below:

| energy density: | 350 mJ/cm$^2$ |
|---|---|
| pulse number: | 1–10 shots |
| substrate temperature: | 400° C. |

Thus, the amorphous silicon is crystallized. The substrate after the crystallization is removed from the multi-chamber system through the unloading chamber 11.

After patterning the polycrystalline silicon film 31 into an island form and removing the upper protective silicon oxide layer 32 by known etching, another silicon oxide layer 33 is formed on the silicon layer 31 through an r.f. plasma CVD using TEOS and oxygen to a thickness of 1000 Å.

Then, a gate electrode 34 is formed on the silicon oxide layer 34 by depositing a aluminum layer doped with silicon to a thickness of 6000 Å and pattering it. (FIG. 4B)

Figure 4A:
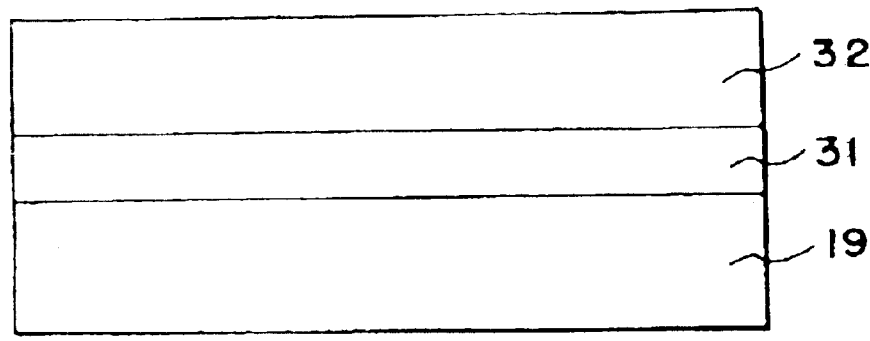
FIGS. 4A–4C are diagrammatic illustrations of a process for manufacturing a TFT on a substrate for an active matrix liquid crystal device utilizing the multi-chamber system of FIG. 3.
Figure 4B:
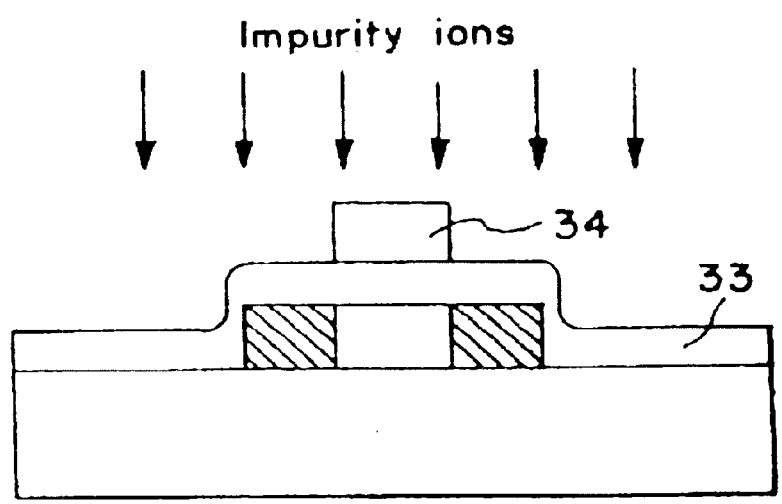

Then, as shown in FIG. 4B, a dopant impurity such as phosphorus or boron is doped in the silicon layer 31 by a plasma doping with the gate electrode as a mask. The dose is $1 \times 10^{15}$–$4 \times 10^{15}$ atoms/cm$^2$.

Figure 4C:
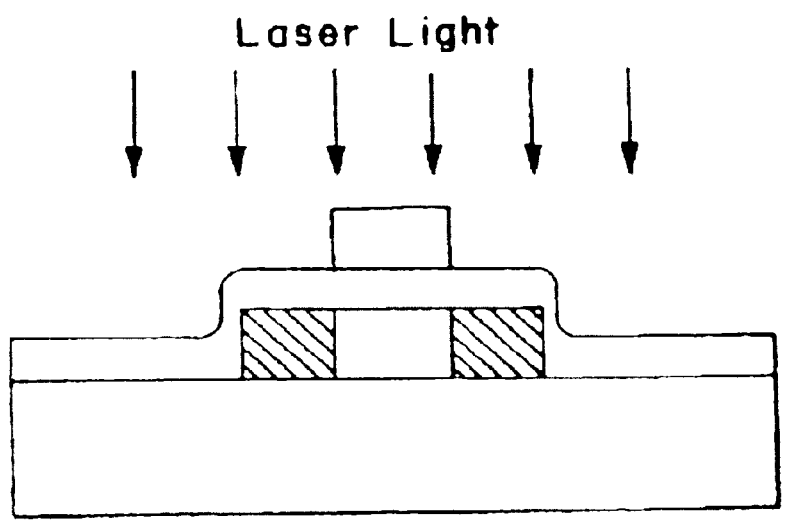

Subsequently, the dopant is activated by using a KrF excimer laser as shown in FIG. 4C. The laser annealing is performed at an energy density 200–350 mJ/cm$^2$, at 300–500° C. substrate temperature.

Thus, a TFT is manufactured on the substrate.

While the figure shows only one TFT, it is obvious that a number of TFTs are manufactured at the same time through the same process. Also, it is advantageous to form a silicide oxide layer on the glass substrate prior to the formation of the amorphous silicon layer. This can be done in the sputtering chamber 15.

What is claimed is:

1. a multi-chamber system comprising:
   a first chamber having an infrared lamp;
   a second chamber having a means for moving a substrate and an exterior laser-emitting apparatus which emits a laser beam having an elongated cross section in one direction while moving the substrate in a direction orthogonal to the elongated direction, and
   a third chamber connected to the first chamber and the second chamber and having a means for transferring the substrate between the first chamber and the second chamber.

2. A multi-chamber system according to claim 1, wherein the exterior laser-emitting apparatus is equipped with an optical system.

3. A multi-chamber system according to claim 1, wherein the laser beam is an excimer laser beam.

4. A multi-chamber system according to claim 1, wherein each of the first chamber and the second chamber comprises an evacuation means.

5. A multi-chamber system comprising:
   a first chamber having an infrared lamp;
   a second chamber having a means for moving a substrate, a quartz window and an exterior laser-emitting apparatus which emits a laser beam having an elongated cross section in one direction while moving the substrate in a direction orthogonal to the elongated direction,
   a third chamber connected to the first chamber and the second chamber and having a means for transferring the substrate between the first chamber and the second chamber.

6. A multi-chamber system according to claim 5, wherein the exterior laser-emitting apparatus is equipped with an optical system.

7. A multi-chamber system according to claim 5, wherein the laser beam is an excimer laser beam.

8. A multi-chamber system according to claim 5, wherein each of the first chamber and the second chamber comprises an evacuation means.

9. A multi-chamber system comprising:
   a first chamber having an infrared lamp;
   a second chamber having a means for moving a substrate and an exterior laser-emitting apparatus which emits a laser beam having an elongated cross section in one direction while moving the substrate in a direction orthogonal to the elongated direction,
   wherein the first chamber and the second chamber are connected to each other via at least one gate valve.

10. A multi-chamber system according to claim 9, wherein the exterior laser-emitting apparatus is equipped with an optical system.

11. A multi-chamber system according to claim 9, wherein the laser beam is an excimer laser beam.

12. A multi-chamber system according to claim 9, wherein each of the first chamber and the second chamber comprises an evacuation means.

13. A multi-chamber system comprising:
    a first chamber having an infrared lamp;
    a second chamber having a means for moving a substrate, a quartz window and an exterior laser-emitting apparatus which emits a laser beam having an elongated cross section in one direction while moving the substrate in a direction orthogonal to the elongated direction,
    wherein the first chamber and the second chamber are connected to each other via at least one gate valve.

14. A multi-chamber system according to claim 13, wherein the exterior laser-emitting apparatus is equipped with an optical system.

15. A multi-chamber system according to claim 13, wherein the laser beam is an excimer laser beam.

16. A multi-chamber system according to claim 13, wherein each of the first chamber and the second chamber comprises an evacuation means.

17. A multi-chamber system comprising:
    a film-deposition chamber;
    a first chamber having an infrared lamp; and
    a second chamber having a means for moving a substrate and an exterior laser-emitting apparatus which emits a laser beam having an elongated cross section in one direction while moving the substrate in a direction orthogonal to the elongated direction.

18. A multi-chamber system according to claim 17, wherein the exterior laser-emitting apparatus is equipped with an optical system.

19. A multi-chamber system according to claim 17, wherein the laser beam is an excimer laser beam.

20. A multi-chamber system according to claim 17, wherein each of the first chamber and the second chamber comprises an evacuation means.

21. A multi-chamber system comprising:
    a film-deposition chamber;
    a first chamber having an infrared lamp; and
    a second chamber having a means for moving a substrate, a quartz window and an exterior laser-emitting apparatus which emits a laser beam having an elongated cross section in one direction while moving the substrate in a direction orthogonal to the elongated direction.

22. A multi-chamber system according to claim 21, wherein the exterior laser-emitting apparatus is equipped with an optical system.

23. A multi-chamber system according to claim 21, wherein the laser beam is an excimer laser beam.

24. A multi-chamber system according to claim 21, wherein each of the first chamber and the second chamber comprises an evacuation means.

* * * * *